United States Patent [19]

Bullock

[11] 4,070,659
[45] Jan. 24, 1978

[54] MAGNETIC BUBBLE DOMAIN MEMORY CHIP WITH MAJOR/MINOR BUBBLE PATH CONFIGURATION

[75] Inventor: David Carl Bullock, Dallas, Tex.

[73] Assignee: Texas Instruments Incorporated, Dallas, Tex.

[21] Appl. No.: 695,485

[22] Filed: June 14, 1976

[51] Int. Cl.² .............................................. G11C 19/08
[52] U.S. Cl. ........................................ 365/15; 365/12; 365/39
[58] Field of Search ................................ 340/174 TF

[56] References Cited

U.S. PATENT DOCUMENTS

| 3,971,005 | 7/1976 | Buhrer | 340/174 TF |
| 3,991,411 | 11/1976 | George | 340/174 TF |
| 3,999,172 | 12/1976 | Bhandarkar | 340/174 TF |

Primary Examiner—James W. Moffitt
Attorney, Agent, or Firm—James T. Comfort; Rene' E. Grossman; William E. Hiller

[57] ABSTRACT

Magnetic bubble domain memory circuit design in which magnetizable overlay patterns of magnetically soft material, e.g. permalloy, are provided on a magnetic bubble-supporting magnetic layer to define bubble propagation paths including transfer gate elements and combined replicate/transfer gate elements. The replicate/transfer gate elements are operable in two modes either combining the replicate and transfer bubble functions in a first mode or operable to effect a bubble transfer function in a second mode, wherein a magnetic bubble is transmitted from one section of a bubble circuit propagation path to another. Processing of data through the use of the magnetic bubble domains may occur in a first-in/first-out basis in one embodiment and on a last-in/last-out basis in another embodiment of the bubble memory. A pulse generator is associated with the transfer gate and the replicate/transfer gate structures. The pulse generator associated with the replicate/transfer gate elements is controlled to deliver pulses in two different modes for respectively selectively actuating the replicate/transfer gate elements to perform the composite replicate/transfer function or the transfer function alone. The transfer gate elements and the replicate/transfer gate elements are configured to include head portions of pickax shape.

2 Claims, 14 Drawing Figures

MAGNETIC BUBBLE DOMAIN MEMORY CHIP WITH MAJOR/MINOR BUBBLE PATH CONFIGURATION

This invention relates to magnetic bubble domain memory structures, and in particular to bubble circuit propagation paths having respective transfer gate and combined replicate/transfer gate structures with head members of a unique pickax configuration. The transfer gate structures and the replicate/transfer gate structures respectively connect adjacent sections of the bubble propagation path pattern to provide communication therebetween for bubble movement. In the latter connection, the replicate/transfer gate structures may be operated in a composite transfer-replicate function mode or alternatively in a transfer function mode alone in controlling the movement of bubbles along the propagation path circuit.

Typically, magnetic domain memories include one or more memory storage loops, accommodating a plurality of magnetic single-walled domains or bubbles, each of which represents one bit of binary information. These bubbles may be rotated about individual memory storage loops in a synchronized and controlled manner such that access to the stored information imparted thereby can be gained. The memory storage loops are usually organized as a plurality of minor storage loops associated with a major storage loop, wherein information in the form of a series of magnetic bubble domains and voids respectively representing binary "1's" and "0's" may be transferred between the major loop and each of the respective minor loops so as to enable information to be read from the memory and to be written into the memory as desired. The magnetic bubble domain memory chip comprises a substrate of non-magnetic material on which a planar film or layer of magnetic material capable of supporting magnetic bubble domains is disposed. The magnetic bubbles are caused to travel along predetermined paths within the layer of bubble-supporting magnetic material by laying down a magnetizable bubble propagation path pattern on the layer of magnetic material as a series of thin film propagation elements of magnetically soft material, e.g. permalloy, in the form of tiny geometric shapes or circuit elements. In this respect, a magnetic drive field within the plane of the layer of magnetic material is rotated which causes the individual propagation elements included in the bubble propagation path pattern to be sequentially polarized in a cyclical sequence causing the individual bubbles to be propagated in a step-wise movement along the path as defined by the magnetizable propagation elements. One such overlay pattern commonly employed in a magnetic bubble domain memory chip is the so-called series of alternating T-shaped and bar-shaped permalloy elements. A chevron pattern of permalloy elements is another common configuration for this purpose. Magnetic bubble domain memories and the general types of bubble propagation paths employed therewith in the processing of data as represented by the presence and absence of magnetic bubble domains as hereinbefore described are disclosed in the article "Magnetic Bubbles" by Andrew H. Bobeck and H. E. D. Scovil, appearing in *Scientific American* magazine, pages 78-90 (June 1971).

While these bubble propagation path patterns on a magnetic bubble domain memory chip have generally provided satisfactory operation, the small size of the magnetizable circuit elements as employed in the bubble propagation path pattern overlay as used for magnetic bubbles of 5 micron size or smaller and the precision with which these soft magnetic elements must be applied to the bubble-supporting magnetic layer present difficulties in maintaining the limited alignment tolerances required to produce a bubble propagation path pattern complete with bubble function-determining components, such as bubble generators, replicators, annihilators and transfer gates, for example, which operates in a fully reliable manner in propagating bubbles in guided paths about the bubble-supporting magnetic layer of the memory chip. In this connection, the movement of each of the bubbles on the memory chip as to direction and the action thereon by various bubble function-determining components must be precise and wholly predictable if the memory chip is to perform in a manner enabling data retrieval as represented by the presence or absence of magnetic bubbles when read from the memory chip output by suitable magnetic bubble detectors. Additionally, it is desirable to so construct the memory chip to enable non-destructive readout of data, thereby requiring a replicate function on the chip to replicate respective bubbles as these bubbles are being directed onto a readout path for subsequent sensing by a bubble detector and erasure by an annihilator. The replicate bubble is returned to the same virtual position in a bubble propagation path from which the bubble to be subsequently detected had departed to preserve the data intact on the memory chip. To this end, magnetic bubble domain memory chips commonly include a bubble replicate function therewith in the form of a particular bubble replicate member disposed in the bubble propagation path pattern at an appropriate location and operable to effectively split a bubble to be subsequently read out, thereby producing two bubbles with the second replicate bubble being returned to the same virtual position departed by the bubble to be readout. Bubble replicator structures heretofore known, in a like manner to the individual propagation elements of magnetically soft material included in the bubble propagation path pattern, have been subject to extremely narrow tolerance ranges in relation to control conductors to which the bubble replicators are responsive in order to properly perform the replicate function in duplicating a bubble to be read out by a bubble detector on the chip.

SUMMARY OF THE INVENTION

In accordance with the present invention, a magnetic bubble domain memory chip is provided in which the bubble propagation path pattern of magnetically soft material as disposed on the layer of bubble-supporting magnetic material includes a replicate/transfer gate structure located between adjacent sections of the bubble propagation path pattern—in particular, between the bubble storage section and the output bubble section. The replicate/transfer gate structure is alternatively operable in a first composite replicate-transfer mode wherein a bubble is replicated while being transferred from the bubble storage section to the output bubble section for readout and in a second transfer mode where a bubble is merely transferred from the bubble storage section to the output bubble section. The operation of the replicate/transfer gate structure is determined by a control means including a pulse generator which is effective to generate pulses of two different widths for respectively actuating the replicate/transfer gate structure in either its first or second mode as described.

More specifically, the magnetic bubble domain memory chip is provided with a multi-level assembly disposed on the planar layer of bubble-supporting magnetic material, the multi-level assembly including patterned first and second metallization levels separated by an intermediate insulation layer. The first metallization level includes the control conductors for the bubble function-determining components and the propagation elements which constitute the permalloy overlay pattern forming the second metallization level. In this respect, the replicate/transfer gate structure includes an elongated hair-pin configuration forming part of the first metallization level of control conductors. An insulation layer is disposed atop the hair-pin structure, and at least one pickax structure of permalloy material is disposed on the insulation layer as part of the second level metallization layer, the pickax structure being in registration with the hair-pin structure disposed thereunder and including opposite end extensions of the pickax configuration beyond the outer boundaries of the hair-pin structure. Operation of the pulse generator incident upon the replicate/transfer gate structure in the first mode causes a bubble introduced onto one end of the pickax head to be spread laterally across the head to assume a generally arcuate shape. When the in-plane rotary magnetic field is reoriented in its cyclical movement over a selected angular range, e.g. 45°, the spread-out arcuate bubble is split in half in response to the pulse to form a replicate bubble which is returned to the bubble propagation path portion forming an input to the replicate/transfer gate structure, while the trailing bubble is then transferred to a readout bubble propagation path for subsequent sensing by a bubble detector. In the second or transfer mode, a bubble introduced onto one end of the pickax head of the replicate/transfer gate structure is directly transferred to the bubble propagation read out path in response to the activation of the replicate/transfer gate structure by a pulse of shorter width from the pulse generator. Thus, the pulse generator is operable in either of two modes to produce respective pulses of predetermined different widths so as to activate the replicate/transfer gate structure for alternative operation in first and second modes, as described.

Other aspects of the invention involve the use of X-bar elements in conjunction with the pickax transfer gate structures and replicate/transfer gate structures, the over-all import of this composite bubble propagation path pattern being to increase the tolerance range in forming the second level metallization pattern of magnetically soft material defining the bubble propagation path circuit. In this respect, the particular replicate/transfer gate structure disclosed herein permits a greater alignment tolerance with respect to its relationship to the control conductor or lead associated therewith for imparting activating pulses to operate the replicate/transfer gate structure in its first and second modes, whereas the gaps between successive X-bar elements included in the bubble propagation path pattern can be of a dimension sufficiently wide as to be substantially equal to the width of the individual bars included in the X-bar elements without detracting from the performance of the bubble memory chip.

It is also contemplated that the bubble memory chip may include bubble propagation path patterns enabling the processing of data to occur on a first-in/first-out basis (FIFO) in a first embodiment, and in which data processing occurs on a last-in/first out basis (LIFO) in a second embodiment, wherein the input and output layers of the chip may be open-ended including a bubble generator at the start of the input section and a bubble detector at the end of the output section.

Figure 1:
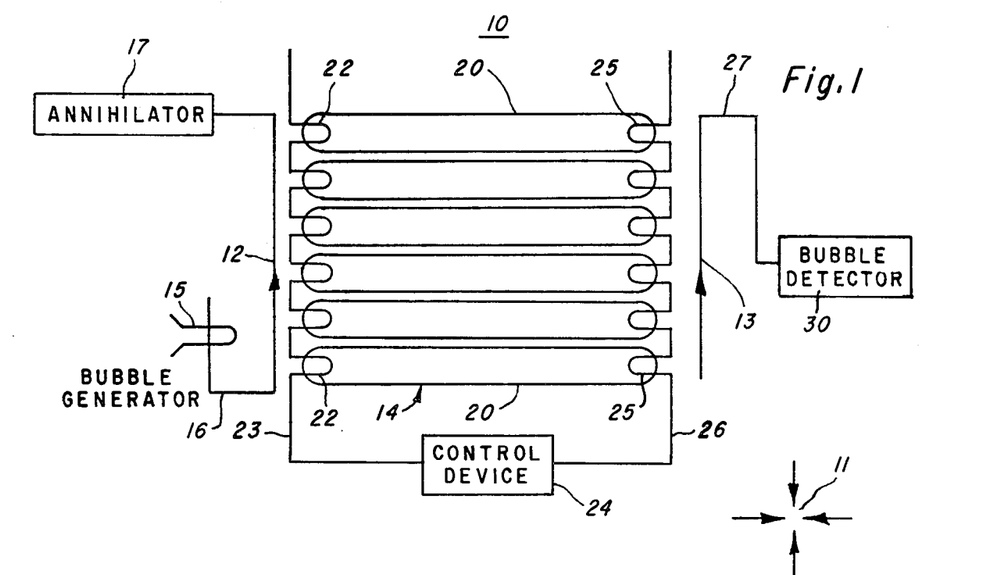
FIG. 1 is a schematic view illustrating a magnetic bubble domain memory chip as constructed in accordance with one aspect of the present invention.

Referring more specifically to the drawings, FIG. 1 schematically illustrates a magnetic bubble domain memory chip as constructed in accordance with the present invention. It will be understood that the magnetic bubble chip comprises a non-magnetic substrate portion having a planar bubble-supporting layer possessing a uniaxial anisotropy, the bubble-supporting planar magnetic layer being generally designated at 10. Typically, the non-magnetic substrate is a non-magnetic rare earth garnet and the film or layer 10 is an epitaxially deposited garnet layer, e.g. $(YSm)_3(FeGa)_5O_{12}$, of the order of about 5 microns in thickness and having an easy magnetization in a direction perpendicular to the plane of the layer.

In accordance with the present invention, a bubble propagation path pattern means is disposed on the layer of magnetic material 10 for guiding the movement of the bubbles in the layer 10 in response to a change in orientation of a rotary magnetic field within the plane of the layer 10, the rotary in-plane magnetic field being schematically shown at 11. The bubble propagation path pattern means may comprise an overlay pattern of magnetically soft material, e.g. permalloy, disposed on a major surface of the planar magnetic layer 10. As shown in FIG. 1, this overlay pattern of magnetically soft material is generally arranged to include a bubble input section 12, a bubble output section 13, and an intermediate bubble storage section 14 disposed between the bubble input section 12 and the bubble output section 13. The bubble input section 12 includes a bubble generator 15 which may be of a suitable form, such as a hair-pin structure, to produce bubbles at each complete rotation of the in-place magnetic drive field 11 for propagation along an input major path 16 which may take the form of an input major loop. However, as illustrated in FIG. 1, the bubble input section 12 terminates in a bubble annihilator 17, such that the input path 16 constitutes a non-reentrant bubble input path. The intermediate bubble storage section 14 comprises a plurality of minor loops 20 which extend between the bubble input section 12 and the bubble output section 13 in parallel relationship to each other so as to present bight portions at the opposite ends of each respective minor loop 12 in proximity to the bubble input section 12 and the bubble output section 13.

A plurality of two-way tranfer gates 22, corresponding in number to the minor loops 20, are operably interconnected by virtue of a control line 23 leading to a pulse generator. It will be understood that upon properly pulsing the control line 23 via a control means 24 including a variable pulse generator, a bubble may be transferred from the bubble input section 12 to a particular minor loop 20 via the transfer gate 22 corresponding thereto and vice versa. Thus, bubbles may travel in either direction between the bubble input section 12 and each of the respective minor loops 20 upon proper activation of the respective transfer gates 22 associated with each of the minor loops 20.

In a similar manner, a plurality of replicate/transfer output gates 25 are interposed between the respective minor loops 20 and the output bubble section 13, being arranged in interrelation with the bight portions of minor loops 20 at the ends thereof opposite from the transfer gates 22. The plurality of replicate/transfer output gates 25 are operably interconnected by a control line 26 which is connected to the control means 24. The variable pulse generator of the control means 24 is operable in first and second modes to produce respective first and second pulses of different widths. In this connection, each of the replicate/transfer output gates 25 is alternately operable in a first and second mode, wherein the replicate/transfer output gate 25 upon activation by the proper pulse from the pulse generator along control line 26 performs a composite replicate/transfer function in which the bubble incident thereon is replicated to provide a duplicate bubble for return to the bubble storage loop 20 from which it was input to the replicate/transfer output gate 25, while the bubble is transferred to the output bubble section 13 for propagation along a read out bubble path 27 terminating in a bubble detector 30. Thus, it will be seen that the data processing afforded by the magnetic bubble domain memory chip of FIG. 1 may be of non-destructive character in that the data transferred to the output bubble section 13 from any of the replicate/transfer output gates 25 is reproduced by a replicated function associated with the gates 25 so as to retain the same virtual positions in the minor loop 20 from whence such data is input to the replicate/transfer output gate 25.

Figure 2:
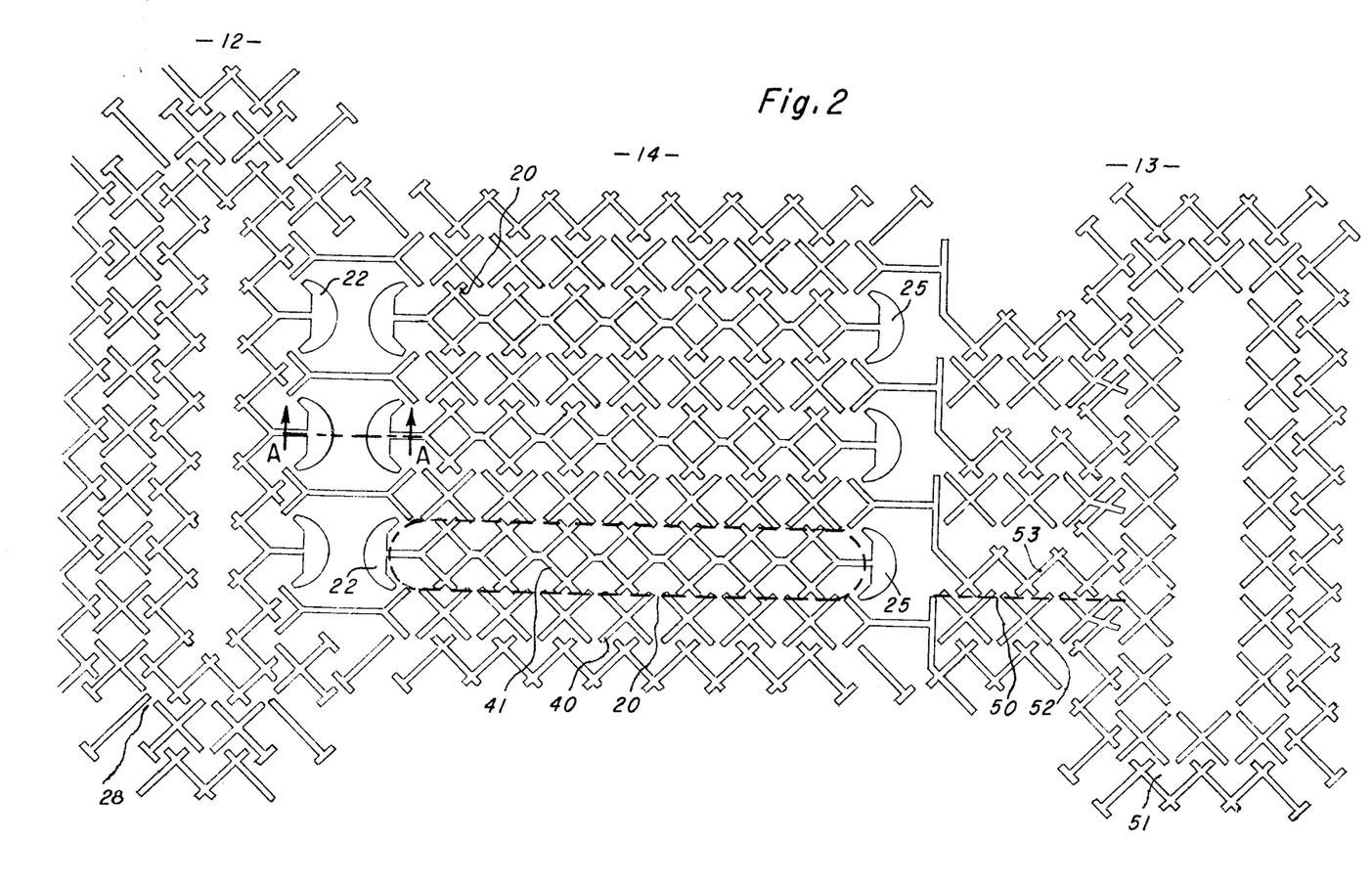
FIG. 2 is a plan view of a portion of the bubble propagation path pattern employed with the magnetic bubble domain memory chip of FIG. 1.

Referring now to FIG. 2, a detailed diagrammatic plan view of the magnetic bubble memory chip schematically illustrated in FIG. 1 is shown, wherein the bubble propagation path pattern means generally comprises magnetically soft elements of X-bar configuration. Thus, it will be observed that the bubble input section 12 is generally arranged as an input major loop 28 of serially arranged X-bar permalloy elements for inputting data in the form of chains of bubbles representing "1's" and voids representing "0's." The bubble input major loop 28 passes along each of the two-way transfer gate structures 22 which are arranged between the bubble input loop 28 and the respective bubble storage minor loops 20 which also comprise serially arranged X-bar elements of magnetically soft material.

Figure 3:
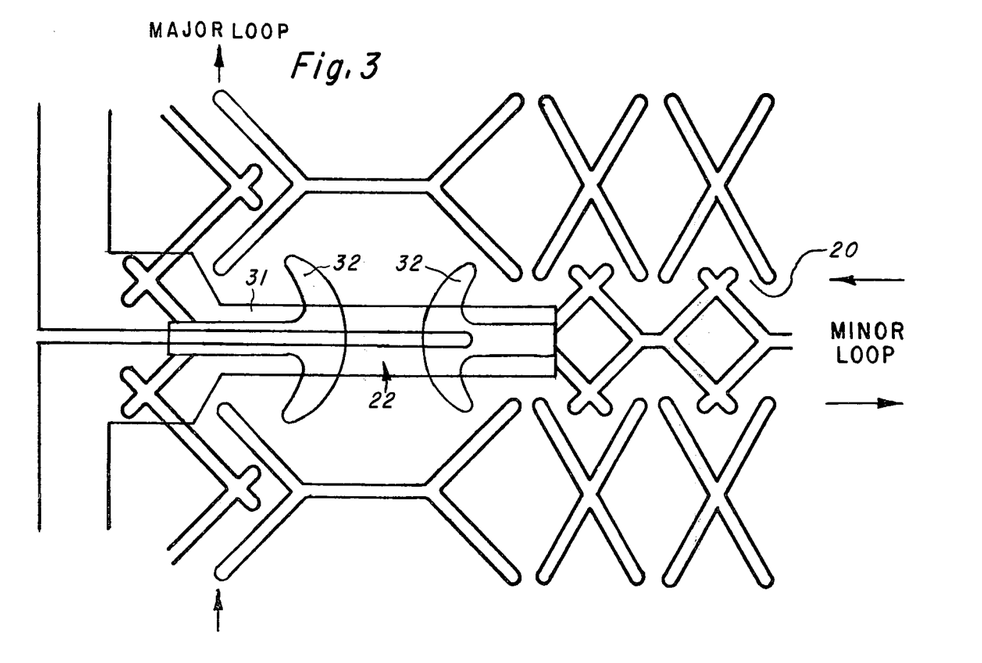
FIG. 3 is an enlarged plan view of a portion of the magnetic bubble propagation path pattern shown in FIG. 2 illustrating a two-way transfer gate as employed between a bubble input section and a bubble storage section in the magnetic bubble domain chip.
Figure 4:
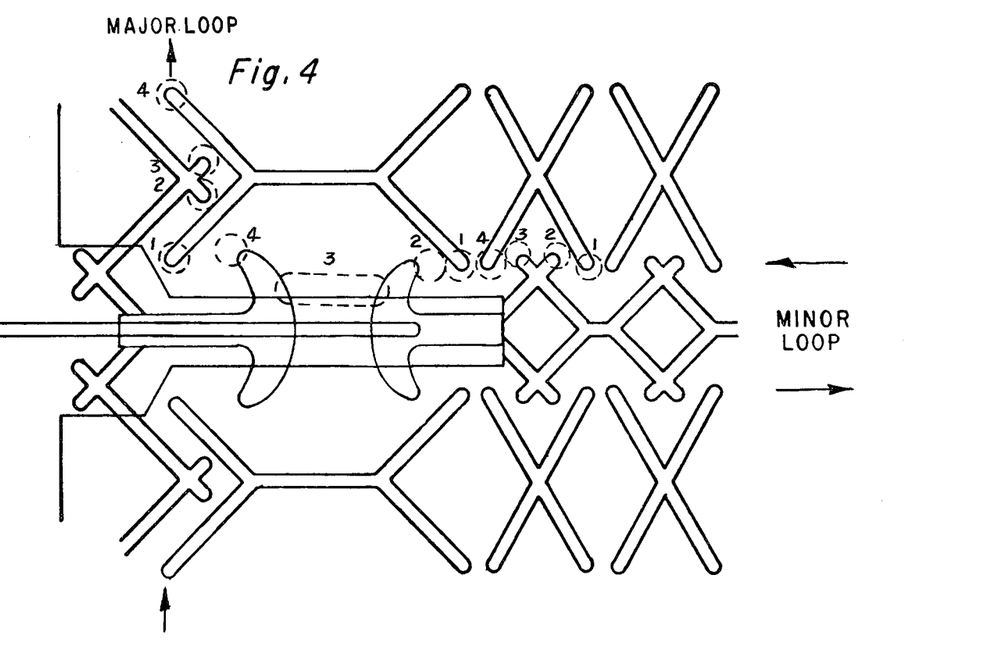
FIG. 4 is a diagrammatic plan view similar to FIG. 3, but showing the propagation movement of a magnetic bubble in being transferred by the transfer gate from a minor storage loop to a major path of the bubble input section.
Figure 5:
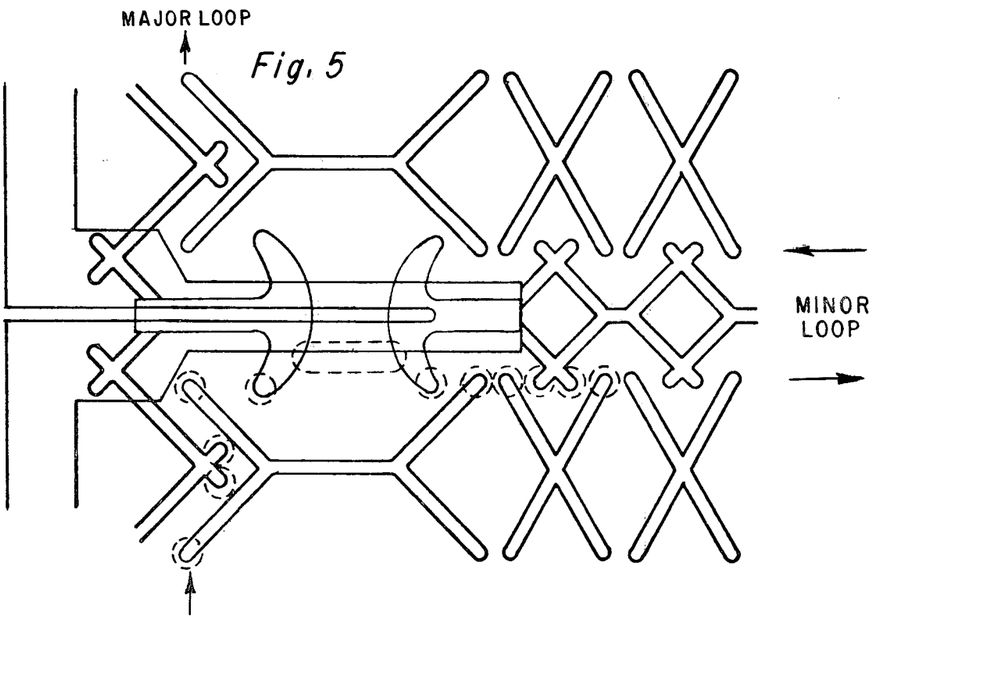
FIG. 5 is a diagrammatic plan view similar to FIGS. 3 and 4, but showing the propagation movement of a bubble as the bubble is transferred from the major path of the bubble input section to a minor storage loop via the transfer gate.

Referring to FIG. 3, a two-way transfer gate 22 as disposed between the input bubble section 12 and the bubble storage section 14 of minor loops 20 is illustrated in greater detail. The transfer gate 22 comprises a first metallization layer in the form of a U-shaped hair-pin structure 31. A patterned insulation layer overlies the U-shaped hair-pin structure 31 of the transfer gate 22, and a second metallization layer is formed thereon to include opposed pickax configurations arranged in spaced relation with respect to each other and defining generally arcuate heads 32,32 having opposite end extensions disposed beyond the outer boundaries of the hair-pin structure 31. Each of the transfer gates 22 is operable upon suitable activation by a control pulse provided from a pulse generator included in the control means 24 to transfer respective magnetic bubbles between the input bubble section 12 and the minor storage loop 20 corresponding thereto selectively in either direction. In this manner, new data information may be written into the respective minor loops 20 from the input bubble section 12 to replace data information which is to be removed from the minor loop 20. FIG. 4 schematically illustrates the propagation of a single magnetic bubble, shown in dashed lines, as it travels responsive to the re-orientation of the rotary in-plane magnetic field 11 from a minor loop 20 to a major loop 28 which is included in the input bubble section 12, the transfer being via one of the twoway transfer gates 22. The respective positions assumed by the bubble for each succesive 90° reorientation of the rotary in-plane magnetic field 11 through a complete 360° cycle are identified in FIG. 4 by the numbers 1, 2, 3 and 4. It will be understood that a similar sequence of bubble movement in relation to re-orientation of the rotary in-plane magnetic field 11 occurs in other figures of the drawings depicting bubble propagation movement. FIG. 5 illustrates the propagation sequence of a single magnetic bubble in the reverse direction as the bubble leaves the major loop 28 of the input bubble section 12 and enters a minor loop 20 via the transfer gate 22.

Between the input bubble section 12 and the output bubble section 13, the plurality of bubble propagation paths defining bubble storage units 14 is disposed, these bubble propagation paths taking the form of a plurality of minor loops. As shown, the minor loops 20 are defined by X-bar elements of soft magnetic material, e.g. permalloy, which are successively arranged in alternating rows of spaced X-bar elements and interlaced X-bar elements 41. The minor bubble storage loops are defined by the path skirting the periphery of the respective rows of interlaced X-bar elements 41. One such minor loop 20 is shown in dashed lines in FIG. 2, it being understood that the remaining minor loops 20 are similarly defined.

Figure 6:
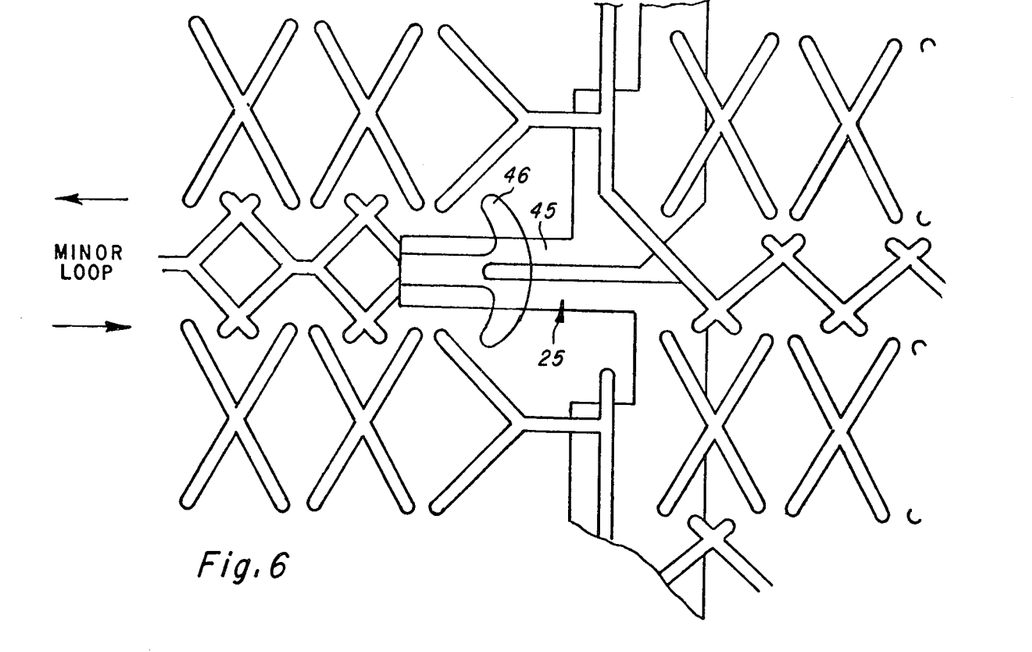
FIG. 6 is an enlarged plan view of a portion of the magnetic bubble propagation path pattern shown in FIG. 2, illustrating the replicate/transfer output gate located between the bubble storage section and the output section of the magnetic bubble domain memory chip.

At the opposite end of the respective minor loops 20 from the transfer gates 22, replicate/transfer output gate structures 25 are provided, the replicate/transfer output gates 25 communicating with the output bubble section 13 and being alternately operable in first and second modes as hereinafter described to enable the data information represented by the chains of bubbles and bubble voids to be read out of the memory. To this end, FIG. 6 shows a replicate/transfer output gate 25 in enlarged detailed form. The replicate/transfer output gate 25 is similar in configuration to the two-way transfer gate 22, except that only a single pickax structure is included therein and it provides a one-way transfer function rather than a reversible transfer function. In this respect, each of the replicate/transfer output gates 25 comprises a first metallization level in the form of a substantially U-shaped hair-pin structure 45. A patterned insulation layer is disposed atop the U-shaped hair-pin structure 45, and a second metallization layer in the form of a head member configured as a pickax structure 46 is mounted thereon, the pickax structure 46 being in registration with the hari-pin structure 45 disposed therebeneath and including opposite end extensions located beyound the outer boundaries of the hair-pin structure 45. It will be observed that the leading edge of the pickax structure 46 of the replicate/transfer output gate 25 is the arcuate perimeter of the head member which faces the output bubble section 13, whereas the arcuate perimeters of the opposed pairs of pickax structures included in each of the two-way tranfer gates 22 are in facing relationship such that the input bubble section 12 is arranged to be adjacent the opposite surface of the first pickax structures 32 included in each of the two-way transfer gates 22.

In accordance with the present invention, the replicate/transfer output gate 25 has a dual operation including a composite replicate/transfer bubble function in a first mode and a transfer function only in a second mode. The operation of the replicate/transfer output gate 25 in either the first or the second mode is determined by the width of activating pulses provided thereto along the control conductor 26 integral with the hair-pin structure 45. Thus, the pulse generator of the control means 24 is effective to provide first and second pulses of differing widths to which the replicate/transfer output gate 25 is responsive for operating in either a composite replicate/transfer bubble mode or a transfer bubble mode only.

Figure 7:
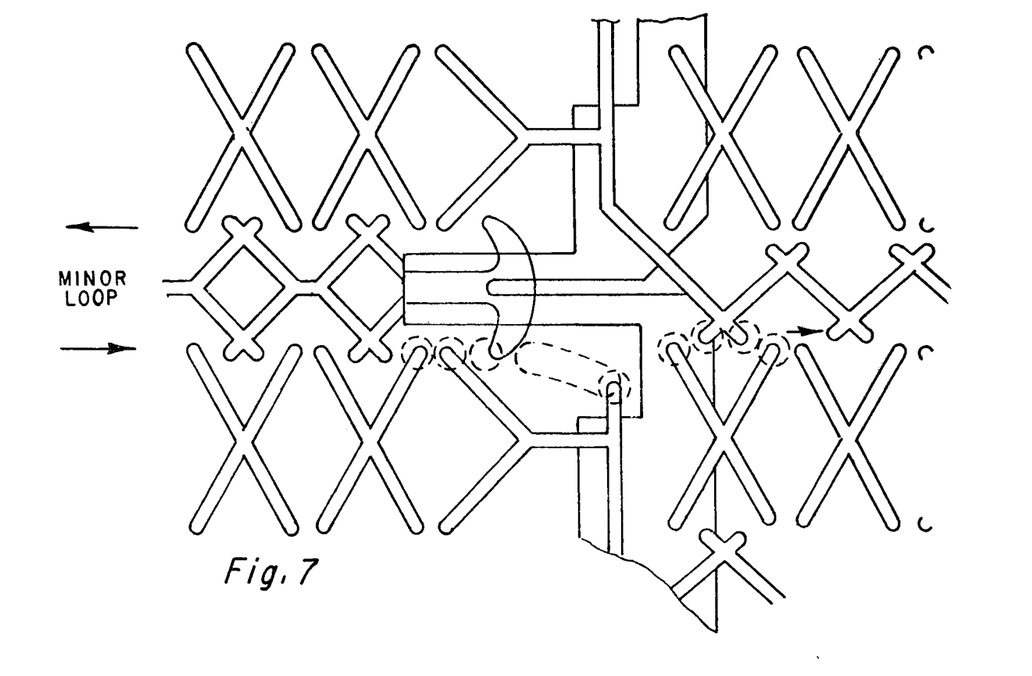
FIG. 7 is a diagrammatic plan view, similar to FIG. 6, but illustrating the opertion of the replicate/transfer output gate in a transfer mode, wherein the propagation movement of a magnetic bubble is shown as it is transferred from a minor storage loop to the bubble output section.

Attention is directed to FIG. 7 which schematically illustrates the operation of a replicate/transfer output gate 25 in a transfer bubble mode only, wherein a bubble directed thereonto from a minor loop is subsequently propagated onto a bubble propagation path portion included in the output bubble section 13 of the memory chip 10. In this respect, it will be understood that the bubble upon leaving the minor loop via the replicate/transfer output gate 25 will be sensed by a bubble detector 30 for readout. In this operating mode, the data information contained in the plurality of minor loops 20 by the sequences of bubbles and bubble voids at respective virtual positions along each of the minor loops would be destroyed upon readout. However, the control means 24 could be operated in a manner causing the nucleation of corresponding bubbles by the bubble generator 15 at the input bubble section 12 as the bubbles are annihilated in the output bubble section 13 upon readout to preserve the data, if desired.

Figure 8:
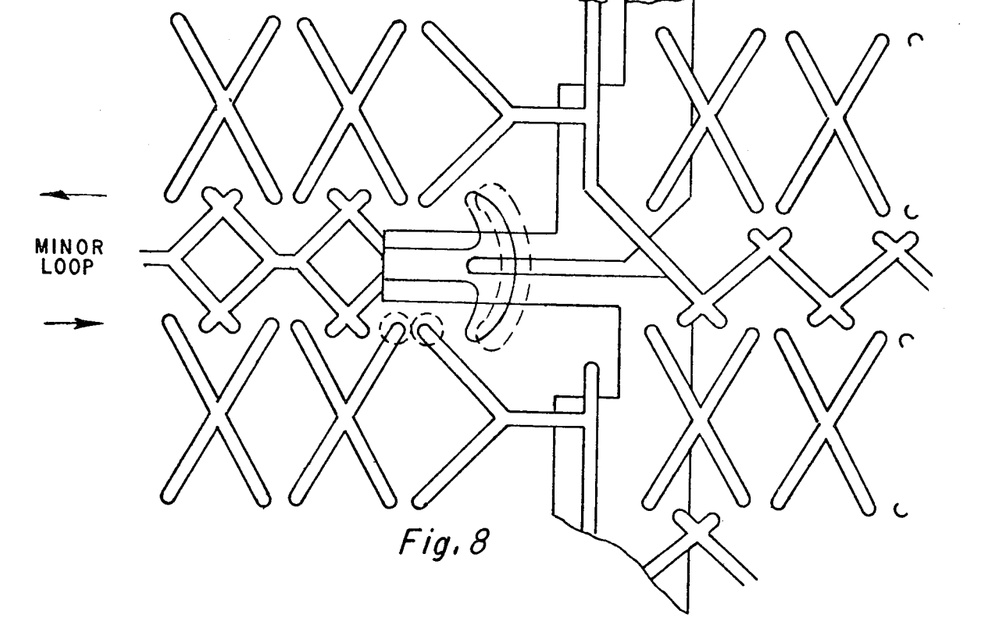
FIG. 8 is a diagrammatic plan view, similar to FIGS. 6 and 7, but showing the propagation movement of a bubble when the replicate/transfer output gate is operated in its alternate mode providing a composite replicate/transfer function.
Figure 9:
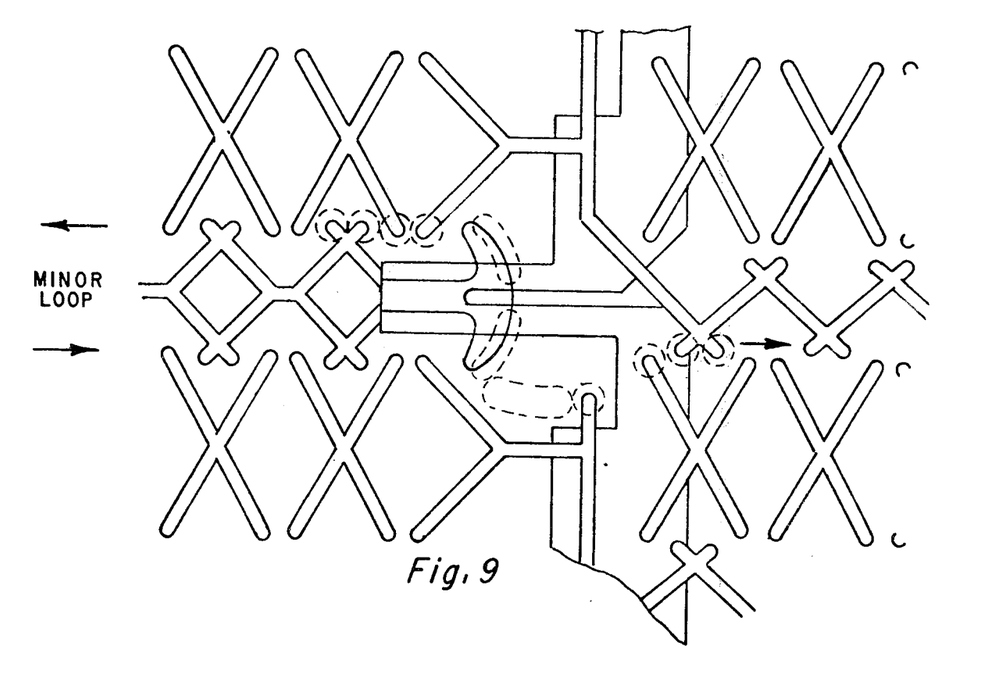
FIG. 9 is a diagrammatic plan view similar to FIG. 8, but showing the propagation movement of the bubble and the replicate bubble occurring at a later stage with respect to the illustration in FIG. 8.

FIGS. 8 and 9 illustrate in sequence the operation of a replicate/transfer output gate 25 in a composite replicate/transfer mode responsive to the reception of the required pulse from the pulse generator along the control conductor 26 integral with the hair-pin structure 45. Thus, it will be observed that a bubble entering onto the arcuate head of the pickax configuration 46 will be stretched across the arcuate leading edge thereof as shown in dashed lines at one orientation state of the rotating in-plane magnetic field 11. The electric pulse introduced by the hair-pin structure 45 then splits the bubble, thereby forming a duplicate or replicate bubble, as shown in FIG. 9. The propagation movements of the respective bubble to be read and its replicate bubble to be returned to the minor storage loop are shown in dashed lines in FIG. 9.

Regardless of whether the replicate/transfer output gates 25 are operated in the composite replicate/transfer mode or the transfer mode only, a bubble introduced thereto via a minor loop 20 will be transferred into the bubble output section 13 for subsequent readout by a bubble detector 30 as illustrated in FIG. 1. In one particular embodiment of the magnetic bubble domain memory chip as illustrated in FIG. 2, the output bubble section 13 includes a plurality of entrance paths 50 extending from corresponding replicate/transfer gates 25 and communicating with an output major loop 51. In this connection, the bubble entrance path portions 50 in the output bubble section 13 are generally defined by a propagation path located between adjacent rows of X-bar elements 52 and interlaced bar elements 53. One such bubble entrance path connecting a respective replicate/transfer output gate 25 to the output major loop 51 is shown in dashed lines in FIG. 2. It will be understood that the major loops 28 and 51 in the input and output bubble sections 12 and 13 of the memory chip shown in FIG. 2 may be open-ended in the manner of FIG. 1, in which case the open-ended major input and output paths may have suitable bubble annihilation units operably connected thereto to erase bubbles at an appropriate termination point.

Figure 10:
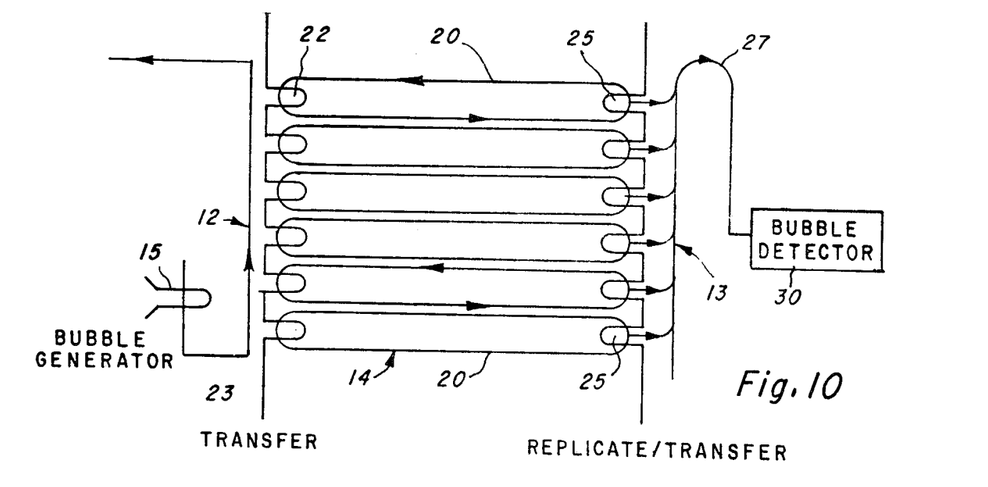
FIG. 10 is a schematic view of a magnetic bubble domain memory chip arranged to provide for data processing on a first-in first-out basis (FIFO)
Figure 11:
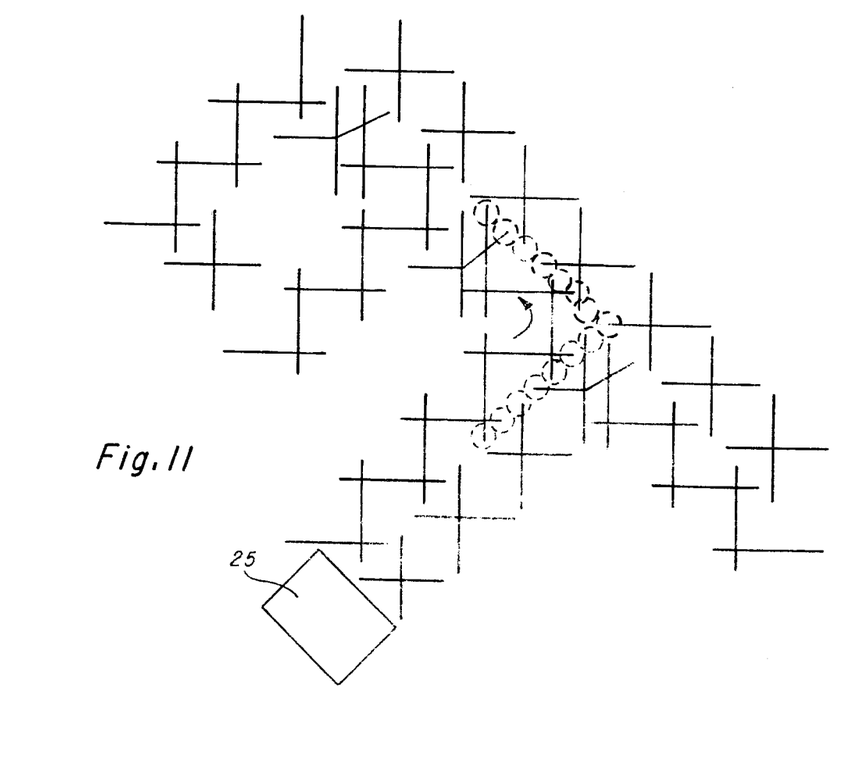
FIG. 11 is an enlarged plan view of a portion of the magnetic bubble chip shown in FIG. 10, and illustrating a left-hand 90° merge arrangement of the bubble propagation path pattern.

FIG. 10 illustrates a magnetic bubble domain memory chip in schematic form, wherein the bubble input section 12, the bubble storage section 14, and the bubble output section 13 are so arranged to enable data processing to occur on a first-in/first-out basis (FIFO). Thus, the writing of data into the minor loops 20 of the memory chip illustrated in FIG. 10 is accomplished in a manner wherein the series of bubbles and bubble voids representative of the first data information introduced into the minor storage loops 20 via the bubble input section 12 will be the first data information accessed from the minor loops 20 by the output bubble section 13 for readout via the replicate/transfer output gates 25. In this connection, FIG. 11 illustrates a particular arrangement of magnetically soft elements included in the bubble propagation path pattern of the output bubble section 13 of FIG. 10 enabling FIFO data processing. FIG. 11 is a left 90° merge arrangement, with propagation movement of a single bubble from a replicate/transfer gate 25 to the open-ended output major loop 27 being shown in dashed lines.

Figure 12:
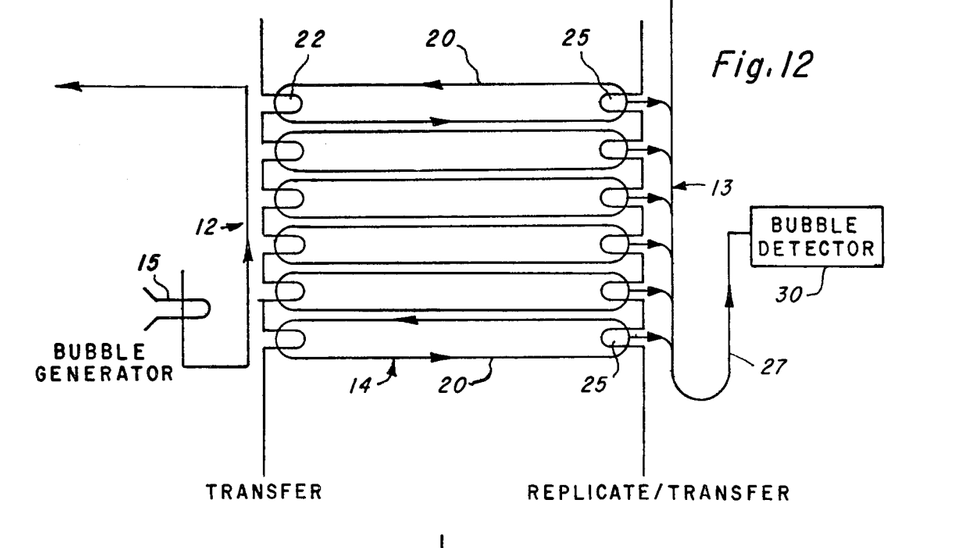
FIG. 12 is a schematic view of a magnetic bubble domain memory chip arranged to provide for data processing on a last-in/first-out basis (LIFO)
Figure 13:
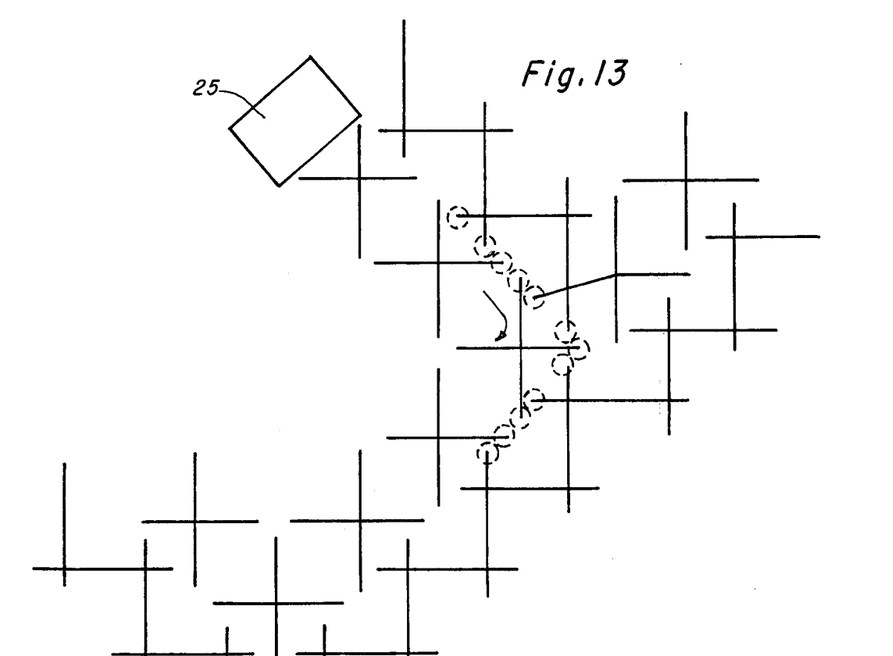
FIG. 13 is an enlarged plan view of a portion of the magnetic bubble chip shown in FIG. 12, and illustrating a right-hand 90° merge arrangement of the bubble propagation path pattern.

FIG. 12 shows another embodiment of the magnetic bubble domain memory chip, wherein the bubble propagation path pattern means is so arranged to enable data processing to occur on a last-in/first-out basis (LIFO), FIG. 13 illustrating a particular bubble propagation path circuit arrangement suitable for accomplishing LIFO data processing as incorporated into the bubble output section 13 of the memory chip of FIG. 12. FIG. 13 is a right 90° merge arrangement, with propagation movement of a single bubble from a replicate/transfer gate 25 to the open-ended output major loop 27 being shown in dashed lines.

Figure 14:
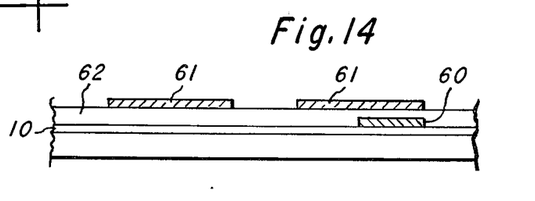
FIG. 14 is a cross-sectional view taken along the line A—A of FIG. 2, and illustrating the multi-level assembly disposed on the bubble-supporting magnetic layer.

FIG. 14 is a cross-sectional view illustrating the multi-level assembly disposed on the planar bubble-supporting magnetic layer 10. As previously described, the multi-level assembly includes first and second patterned metallization layers 60 and 61 separated by an intermediate insulation layer 62 which covers the planar surface of the magnetic layer 10, embedding the patterned first metallization layer 60 of control conductors, etc. The second metallization layer 61 is the overlay bubble propagation path pattern of permalloy material including the individual prepagation elements and the bubble function-determining components.

Although it should be understood that the individual elements of magnetically soft material comprising the bubble propagation path pattern have been described as spaced X-bar elements arranged in respective rows alternating with rows of interlaced bars or interlaced X-bar elements, it will be understood that the two-way transfer gate and replicate/transfer output gate concepts disclosed herein may be employed with bubble propagation path pattern of other types, such as the typical alternating T-shaped and bar-shaped elements defining a bubble propagation path. However, the particular X-bar configuration of the individual magnetically soft elements included in the bubble propagation path pattern means disclosed herein offers advantages in that the permissible tolerance in the width of the gaps between successive elements is of increased range, permitting reliable bubble propagation even when the gaps in the X-bar propagation path are substantially equal to the respective bar widths. Furthermore, the particular form taken by the transfer gates 22 and the replicate/transfer output gates 25 as described herein also offers similar advantages in that the control leads associated with these bubble-function determining components are less subject to a stringent alignment requirement with respect thereto, thereby increasing the permissible tolerance range in this regard also.

Although the invention has been described with respect to specific preferred embodiments thereof, variations and modifications can be made within the scope of the invention by those skilled in the art. Therefore, it is intended that the appended claims be interpreted as broadly as reasonably permitted by the prior art to include all such variations and modifications within the scope of the present invention:

What is claimed is:

1. In a magnetic bubble domain memory, the combination comprising:
   a planar layer of magnetic material in which magnetic bubbles can be moved,
   an overlay pattern of magnetically soft material disposed on a major surface of said planar magnetic layer and defining at least one bubble propagation path on said major surface of said planar magnetic layer for guiding the movement of said bubbles in said layer in response to a change in orientation of a rotary magnetic field within the plane of said layer,
   said overlay pattern of magnetically soft material including a bubble storage section and a bubble output section disposed adjacent thereto,
   a replicate/transfer gate structure of magnetically soft material interposed between said bubble storage section and said bubble output section, said replicate/transfer gate structure comprising an elongated hair-pin configuration disposed as a first level metal layer,
   means defining an insulation layer disposed atop said hair-pin structure,
   at least one pickax structure of magnetically soft material disposed on said insulation layer as a second level metal layer in registration with said hair-pin structure disposed therebeneath and including opposite end extensions of the pickax configuration beyond the outer boundaries of said hair-pin structure,
   pulse generator means operably associated with said replicate/transfer gate structure and adapted to direct pulsed energy thereto in first and second pulsing modes, and
   control means regulating said pulse generator means for operation in either of said first and second modes, wherein said replicate/transfer gate structure is operable to replicate a magnetic bubble domain incident thereon from said bubble storage section for return to said bubble storage section while transferring said incident magnetic bubble domain to said bubble output section in a first mode, and to transfer said incident bubble to said bubble output section in a second mode.

2. In a magnetic bubble domain memory, the combination comprising:
   a planar layer of magnetic material in which magnetic bubbles can be moved,
   an overlay pattern of magnetically soft material disposed on a major surface of said planar magnetic layer and defining at least one bubble propagation path on said major surface of said planar magnetic layer for guiding the movement of said bubbles in said layer in response to a change in orientation of a rotary magnetic field within the plane of said layer,
   said overlay pattern of magnetically soft material including a bubble input section and a bubble storage section disposed adjacent thereto,
   a two-way transfer gate structure of magnetically soft material interposed between said bubble input section and said bubble storage section, said transfer gate structure comprising an elongated hair-pin configuration disposed as a first level metal layer, means defining an insulation layer disposed atop said hair-pin structure, and a pair of pickax structures of magnetically soft material disposed on said insulation layer as a second level metal layer, said pair of pickax structures including respective arcuate head portions located in spaced opposed relation with respect to each other and in registration with said hair-pin structure disposed therebeneath, and each of said pickax structures including opposite end extensions beyond the outer boundaries of said hair-pin structure;

pulse generator means operably associated with said two-way transfer gate structure and adapted to direct pulsed energy thereto, and control means regulating said pulse generator means to deliver pulsed energy to said two-way transfer gate structure, wherein said two-way transfer gate structure is operable to transfer a magnetic bubble domain between said input bubble section and said bubble storage section in either direction depending upon the pulsed energy signal from said pulse generator means.

* * * * *